United States Patent [19]

Grujon

[11] Patent Number: 5,123,034
[45] Date of Patent: Jun. 16, 1992

[54] AUTOMATIC ANOMALOUS EVENT DETECTION

[75] Inventor: Jean-Christophe Grujon, Beaverton, Oreg.

[73] Assignee: Tektronix, Inc., Beaverton, Oreg.

[21] Appl. No.: 702,572

[22] Filed: May 20, 1991

[51] Int. Cl.$^5$ .................. G01R 13/02; G01R 17/00; G01R 29/02

[52] U.S. Cl. ........................ 377/19; 377/39; 377/44; 324/121 R; 364/487

[58] Field of Search ............... 377/39, 19, 44; 324/121 R; 364/487

[56] References Cited

U.S. PATENT DOCUMENTS

| | | | |
|---|---|---|---|
| 4,757,464 | 7/1988 | Zimmermann et al. | 377/39 |
| 4,805,199 | 2/1989 | Muramatsu | 377/39 |
| 4,843,309 | 6/1989 | Kareem et al. | 324/121 R |
| 4,901,009 | 2/1990 | Schultze et al. | 364/487 |

Primary Examiner—John S. Heyman
Attorney, Agent, or Firm—Francis I. Gray

[57] ABSTRACT

An automatic anomalous event detection method uses a pair of counters to count the occurrence of main triggers simultaneously with the occurrence of advanced triggers indicative of anomalous events as defined by an operator. The anomalous events may be defined as either time or voltage qualified events that occur at a much lower rate than the repetition rate of an input analog signal being measured. When the main trigger counter reaches a maximum count, the count of the advanced trigger counter is compared with a range greater than zero to less than the maximum count modified by an operator specified divider. If the advance trigger count is within the range, then an anomalous event is detected and the next advanced trigger signal causes a portion of the input analog signal to be acquired for storage in a waveform memory and subsequent display of the anomalous event.

4 Claims, 2 Drawing Sheets

AUTOMATIC ANOMALOUS EVENT DETECTION

BACKGROUND OF THE INVENTION

The present invention relates to test and measurement instruments, and more particularly to an automatic anomalous event detection method for a digital oscilloscope that automatically detects when anomalous events are occurring and captures such an anomalous event.

In a digital oscilloscope an input analog signal is input both to a digitizer for conversion into digital data for storage in a waveform memory and to a trigger circuit where a trigger signal is derived either from the input analog signal itself or from an external signal, as is well known in the art. The generation of the trigger signal causes the digital oscilloscope to "freeze" a portion of the input analog signal in the waveform memory, the portion being a function of the trigger signal as determined by an operator—pre-trigger, post-trigger or a combination thereof. The trigger signal is generated periodically at the first occurrence of a triggering event, usually the crossing of a threshold level, after a hold-off period from a prior trigger signal determined by the oscilloscope setup.

More recently digital oscilloscopes provide advanced trigger circuitry that allows the generation of trigger signals upon anomalous events. Such advanced trigger circuitry allows the detection of time qualified signals, i.e., signals having pulse widths less than a reference time interval (glitches), greater than the reference time interval, or within or without the reference time interval. The circuitry also allows the detection of voltage qualified signals using dual thresholds, i.e., when a signal crosses and recrosses one threshold while not crossing the other threshold (runts), or is in a metastable state between the two thresholds.

The uninitiated users are likely to find that these functions of the advanced trigger circuitry are not easy to use or are not readily accessible. The anomalous events that the advanced trigger circuitry is designed to detect are embedded in the analog input signal and occur at infrequent rates much lower than the analog input signal's average repetition rate.

What is desired is an automatic anomalous event detection method that brings the functionality of such advanced trigger circuitry to the level of the uninitiated users.

SUMMARY OF THE INVENTION

Accordingly the present invention provides an automatic anomalous event detection method for detecting the occurrence of anomalous events and automatically causing the acquisition of a sample of the input signal in the vicinity of one of the anomalous events. The method is based on the premise that each occurrence of a main trigger indicative of normal events is counted in a main counter, and each occurrence of an advanced trigger indicative of anomalous events is counted in another counter. When the main counter reaches a maximum count, the current count of the other counter is tested to determine whether it falls within a specified range greater than zero and less than the maximum count of the main counter as modified by a divider. If the advanced trigger count is within the specified range, the next occurrence of the advanced trigger causes the oscilloscope to acquire a sample of the input analog signal. Both time qualified anomalous events and voltage qualified anomalous events are automatically detected and acquired in this manner. If no anomalous events are detected in the first pass, then the time interval and/or threshold values are incrementally changed and the process is repeated.

The objects, advantages and novel features of the present invention are apparent from the following detailed description when read in conjunction with the appended claims and attached drawing.

DESCRIPTION OF THE PREFERRED EMBODIMENT

Figure 1:
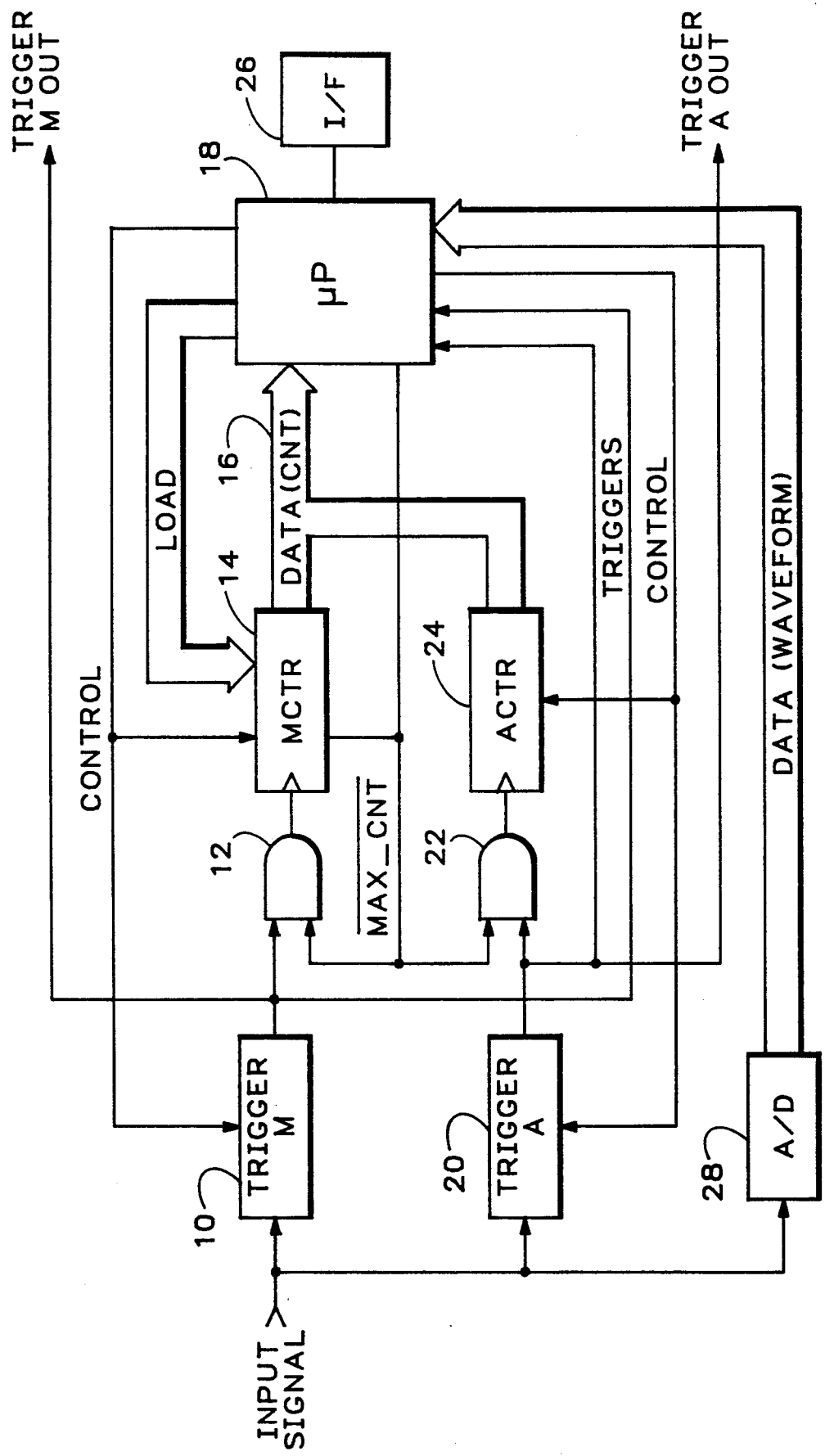
FIG. 1 is a block diagram of a portion of a digital oscilloscope for performing the automatic anomalous event detection method according to the present invention.

Referring now to FIG. 1 an analog signal is input to both a main trigger circuit 10 and an advanced trigger circuit 20. The main trigger signal generated by the main trigger circuit 10, besides being output to normal instrument circuitry, is input to a first AND gate 12, and the advanced trigger signal generated by the advanced trigger circuit 20 is input to a second AND gate 22 as well as to normal instrument circuitry. The outputs of the respective AND gates 12, 22 are input to the clock inputs of respective counters 14, 24. The overflow from the main counter 14 provides a \MAX_COUNT signal that is input to the AND gates 12, 22 as an enable signal. The counts from the counters 14, 24 are output on a data bus 16 that transmits the counts to a processor 18. The processor 18 provides setup values to the respective trigger circuits 10, 20, loads the main counter 14 with an initial count, and resets the other counter 24, all as determined in response to operator inputs via an interface circuit 26. The \MAX$_{13}$COUNT signal from the main counter 14 also provides an interrupt to the processor 18 to signal when to read the counts from the data bus 16. The analog signal also is digitized by an analog-to-digital converter 28 for storage by the processor 18 in response to the triggers.

Figure 2:
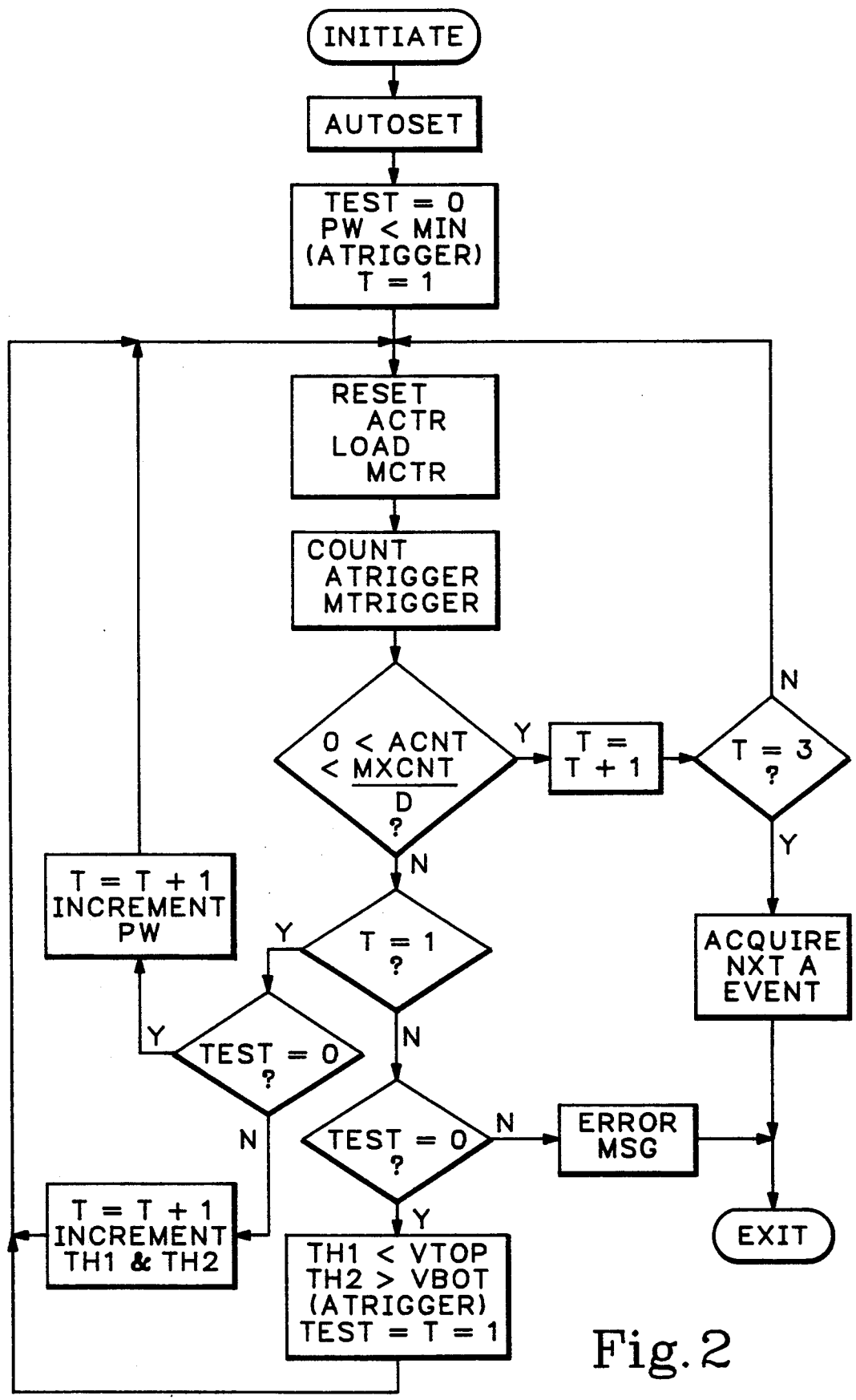
FIG. 2 is a flow chart diagram for the automatic anomalous event detection method according to the present invention.

In operation as shown in FIG. 2 when an operator initializes the automatic anomalous event detection function, such as by pushing a front panel button or an on-screen indicated area, the instrument performs an automatic setup routine, as is well known in the art, and sets the pulse width criteria PW for the advanced trigger circuit 20 to be less than expected nominal pulse widths for the input analog signal. To start the routine the processor 18 resets the other counter 24 and loads the main counter 14 with a count that incorporates a divider provided by the operator via the interface circuit 26. The divider is either preset or provided by an operator via the interface circuit 26 to determine the maximum frequency of occurrence of events that generate the advanced trigger signal which qualifies as an anomalous event. Typically the divider is preset at 1000, but it may be altered by the operator over a range from 10 to $10^6$. Loading the main counter 14 causes the \ MAX_CNT signal to go high to enable the AND gates 12, 22 so that the counters 14, 24 count the respective main and advanced trigger signal pulses. When the \MAX_CNT signal goes low, indicating the end of count of the main counter 14, the AND gates 12, 22 are disabled from passing further trigger pulses to the counters and the processor 18 reads the counts from the counters.

If the ACNT falls within the range of greater than zero and less than the maximum count MXCNT of the main counter as modified by the divider, then an anomalous event has occurred. Otherwise either no anomalous event has occurred, or the event has occurred so often as to be considered a normal event rather than an anomalous event. If an anomalous event has occurred, then the counters are reset and reloaded and the process repeated to verify the anomalous event. If the anomalous event is verified, than the next advanced trigger is accepted by the processor 18 to acquire data for the waveform memory to capture the anomalous event for viewing If no anomalous event is detected in the first pass T=1, then the pulse width value is incremented, such as decreasing it to ninety percent (90%) of its prior value, and the test is repeated.

If no anomalous event is detected by the above procedure for time qualified signals, then the advanced trigger circuit 20 is set up by the processor 18 for detection of voltage qualified signal anomalous events by setting respective thresholds TH1, TH2 to values less than the minimum top level value VTOP and greater than the maximum bottom level value VBOT, respectively. The procedure is repeated as described above, with the threshold values being incremented if no anomalous event is detected in the first pass. If after both time and voltage qualified signal anomalous events have been tested without an anomalous event being detected, then an error message indicating no anomalous events is output.

Thus the present invention provides an automatic anomalous event detection method for detecting time or voltage qualified anomalous events and for acquiring a portion of an input analog signal that contains such an event.

What is claimed is:

1. An apparatus for automatic anomalous event detection comprising:
    means for counting a main trigger signal from a first trigger generator and an advanced trigger signal from a second trigger generator, the trigger signals being derived from an input analog signal and the advanced trigger signal occurring when an anomalous event as defined in the second trigger generator occurs;
    means for comparing the count of the advanced trigger signal with a range of count values when the count of the main trigger signal reaches a maximum count to detect the occurrence of an anomalous event; and
    means for acquiring a portion of the input analog signal as the function of the occurrence of the advanced trigger signal when the comparing means indicates the occurrence of the anomalous event.

2. An apparatus as recited in claim 1 wherein the counting means comprises:
    means for enabling the counting means to count the main trigger signal and the advanced trigger signal;
    a first counter coupled to the enabling means to count the main trigger signal when enabled by the enabling means; and
    a second counter coupled to the enabling means to count the advanced trigger when enabled by the enabling means.

3. An apparatus as recited in claim 2 wherein the enabling means comprises:
    a first AND gate having the main trigger signal as a first input and a maximum count signal from the first counter as a second input, and having an output coupled to the clock input of the first counter; and
    a second AND gate having the advanced trigger signal as a first input and the maximum count signal as a second input, and having an output coupled to the clock input of the second counter so that when the first counter is not at the maximum count the AND gates are enabled by the maximum count signal to pass the respective trigger signals to the respective counters.

4. A method of automatic anomalous event detection comprising the steps of:
    counting a main trigger signal from a first trigger generator and an advanced trigger signal from a second trigger generator, the trigger signals being derived from an input analog signal and the advanced trigger signal occurring when an anomalous event as defined in the second trigger generator occurs;
    comparing the count of the advanced trigger signal with a range of count values when the count of the main trigger signal reaches a maximum count to detect the occurrence of an anomalous event; and
    acquiring a portion of the input analog signal as a function of the occurrence of the advanced trigger signal when the comparing means indicates the occurrence of the anomalous event.

* * * * *